(12) United States Patent
Wang et al.

(10) Patent No.: US 8,878,684 B2
(45) Date of Patent: Nov. 4, 2014

(54) ULTRASENSITIVE DETECTION PLATFORM FOR SENSING MAGNETIC AND/OR ELECTRICAL ENERGY CHANGE

(75) Inventors: Hua Wang, Hillsboro, OR (US); Seyed Ali Hajimiri, La Canada, CA (US)

(73) Assignee: California Institute of Technology, Pasadena, CA (US)

( * ) Notice: Subject to any disclaimer, the term of this patent is extended or adjusted under 35 U.S.C. 154(b) by 769 days.

(21) Appl. No.: 12/959,331

(22) Filed: Dec. 2, 2010

(65) Prior Publication Data
US 2011/0115482 A1 May 19, 2011

Related U.S. Application Data

(63) Continuation-in-part of application No. 12/710,334, filed on Feb. 22, 2010.

(60) Provisional application No. 61/266,083, filed on Dec. 2, 2009, provisional application No. 61/208,132, filed on Feb. 20, 2009.

(51) Int. Cl.
*G08B 21/00* (2006.01)

(52) U.S. Cl.
USPC .......................................... 340/635; 340/652

(58) Field of Classification Search
USPC ............. 340/635, 652, 4, 25.5; 324/252, 228, 324/500
See application file for complete search history.

(56) References Cited

U.S. PATENT DOCUMENTS 6,144,068 A * 11/2000 Kao et al. ...................... 257/335

\* cited by examiner

*Primary Examiner* — Shirley Lu
(74) *Attorney, Agent, or Firm* — Milstein Zhang & Wu LLC; Joseph B. Milstein

(57) ABSTRACT

A scalable and ultrasensitive frequency-shift magnetic array scheme. The theoretical limit of the sensor noise floor is shown to be dominated by the phase noise of the sensing oscillators. To increase the sensitivity, a noise suppression technique, Correlated Double Counting (CDC), is described with no power overhead. As an implementation example, a 64-cell sensor array is designed in a standard 65 nm CMOS process. The CDC scheme achieves an additional 6 dB noise suppression. The magnetic sensing capability of the presented sensor is verified by detecting micron size magnetic particles with an SNR of 14.6 dB for a single bead and an effective dynamic range of at least 74.5 dB. Applications in biosensing are contemplated, among other possible uses. Measurement of electrical properties is also contemplated.

15 Claims, 13 Drawing Sheets

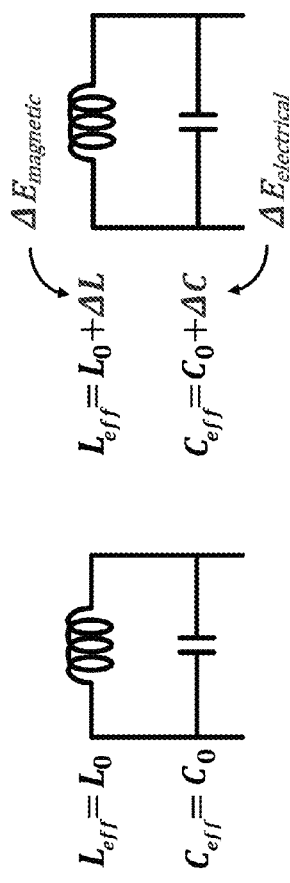
FIG. 1A (PRIOR ART)
FIG. 1B (PRIOR ART)
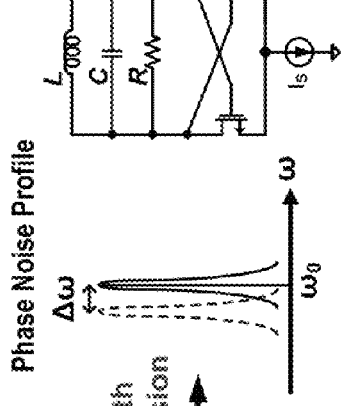
FIG. 2A
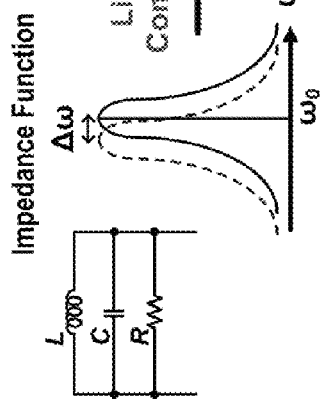
FIG. 2B

ULTRASENSITIVE DETECTION PLATFORM FOR SENSING MAGNETIC AND/OR ELECTRICAL ENERGY CHANGE

CROSS-REFERENCE TO RELATED APPLICATIONS

This application claims priority to and the benefit of co-pending U.S. provisional patent application Ser. No. 61/266,083, filed Dec. 2, 2009, which application is incorporated herein by reference in its entirety. This application is a continuation-in-part of U.S. patent application Ser. No. 12/710,334 filed Feb. 22, 2010, which in turn claimed priority to and the benefit of then co-pending U.S. provisional patent application Ser. No. 61/208,132, Noise Suppression Techniques in High-Precision Long-Term Frequency/Timing Measurements, filed Feb. 20, 2009, each of which applications is incorporated herein by reference in its entirety. This application is related to U.S. patent application Ser. No. 12/399,603 filed Mar. 6, 2009, U.S. patent application Ser. No. 12/399,320 filed Mar. 6, 2009, U.S. patent application Ser. No. 12/559,517 filed Sep. 15, 2009, U.S. patent application Ser. No. 12/830,975 filed Jul. 6, 2010, each of which applications is incorporated herein by reference in its entirety.

FIELD OF THE INVENTION

The invention relates to resonant circuits for sensing electrical or magnetic signals in general and particularly to circuits that operate using a correlated double counting method.

BACKGROUND OF THE INVENTION

LC resonant circuits are well known for use in sensing electrical and magnetic signals.

There is a need for improved circuits for sensing electrical and magnetic signals.

SUMMARY OF THE INVENTION

According to one aspect, the invention features a sensor array. The sensor array, comprises a plurality of sensors fabricated on a monolithic semiconductor substrate, each of the plurality of sensors configured to measure an electrical property or a magnetic property of a specimen of interest, each of the plurality of sensors having an output terminal connected to the sensor with a respective switch, each of the plurality of sensors configured to provide a non-volatile signal at a respective output terminal thereof; an active core configured to be coupled to each of the respective output terminals of each of the plurality of sensors, the active core configured to sense the non-volatile signal of each of the plurality of sensors during a time period when the respective switch is closed; an oscillator configured to provide an oscillation signal to each of the sensors; a frequency counter, the frequency counter configured to be switchably coupled to each of the plurality of sensors, the frequency counter configured to count a number of transitions within a given counting time T and to provide the count as an output; and a controller configured to control a connectivity of the plurality of sensors with the oscillator and the frequency counter, and configured to provide as output a non-volatile signal representative of the count provided by the frequency counter for a respective one of the plurality of sensors during the given counting time T.

In one embodiment, the plurality of sensors and the core are compatible with fabrication by a CMOS process.

In another embodiment, the plurality of sensors is a number N of sensors where N is an integer power of 2.

In yet another embodiment, each of the sensors comprises an inductor.

In still another embodiment, the oscillator is configured to operate in the GHz frequency range.

In a further embodiment, the sensor is configured to detect a quantity of magnetic beads in the range of units of magnetic beads to thousands of magnetic beads.

In yet a further embodiment, one of the plurality of sensors is configured to measure an electrical property and a different one of the plurality of sensors is configured to measure a magnetic property.

In an additional embodiment, one of the plurality of sensors is configured to measure an electrical property and is configured to measure a magnetic property in two different measurement intervals.

In one more embodiment, one of the plurality of sensors is configured to measure an electrical property and is configured to measure a magnetic property in the same measurement interval.

According to another aspect, the invention relates to a sensing method. The sensing method comprises the steps of providing an sensor array, comprising a plurality of sensors configured to measure using a correlated double counting (CDC) scheme at least one of an electrical property and a magnetic property of a specimen of interest; providing a specimen believed to contain a material of interest to be sensed; applying at least a portion of the specimen believed to contain a material of interest to at least one sensor of the sensor array, and leaving at least one sensor of the sensor array lacking a portion of the specimen; sensing a first response of the at least one sensor lacking a portion of the specimen; sensing a second response of the at least one sensor having a portion of the specimen applied thereto using the correlated double counting (CDC) scheme; analyzing the first response and the second response to obtain a result indicative of the material of interest to be sensed; and performing at least one of recording the result, transmitting the result to a data handling system, or to displaying the result to a user.

In one embodiment, the step of applying at least a portion of the specimen believed to contain a material of interest to at least one sensor of the sensor array further comprises the steps of: as needed, washing the sensor to remove unbound material; operating the sensor to obtain an initial response; adding magnetic labels; as needed, again washing the sensor to remove unbound material; and operating the sensor to obtain a final response.

In another embodiment, the steps of sensing a first response and sensing a second response are performed as a function of frequency.

In still another embodiment, wherein one of the plurality of sensors measures an electrical property and a different one of the plurality of sensors measures a magnetic property.

In a further embodiment, one of the plurality of sensors measures an electrical property during a first time interval and measures a magnetic property during a second time interval different from the first time interval.

In yet a further embodiment, one of the plurality of sensors measures an electrical property and measures a magnetic property in the same time interval.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

FIG. 1A illustrates a prior art LC resonance circuit used to detect a magnetic and/or an electrical energy change.

FIG. 1B illustrates how a magnetic and/or an electrical energy change is detected in a prior art LC resonance circuit.

FIG. 2A and FIG. 2B illustrate a line-width compression effect for the LC oscillator.

DETAILED DESCRIPTION

Figure 3:
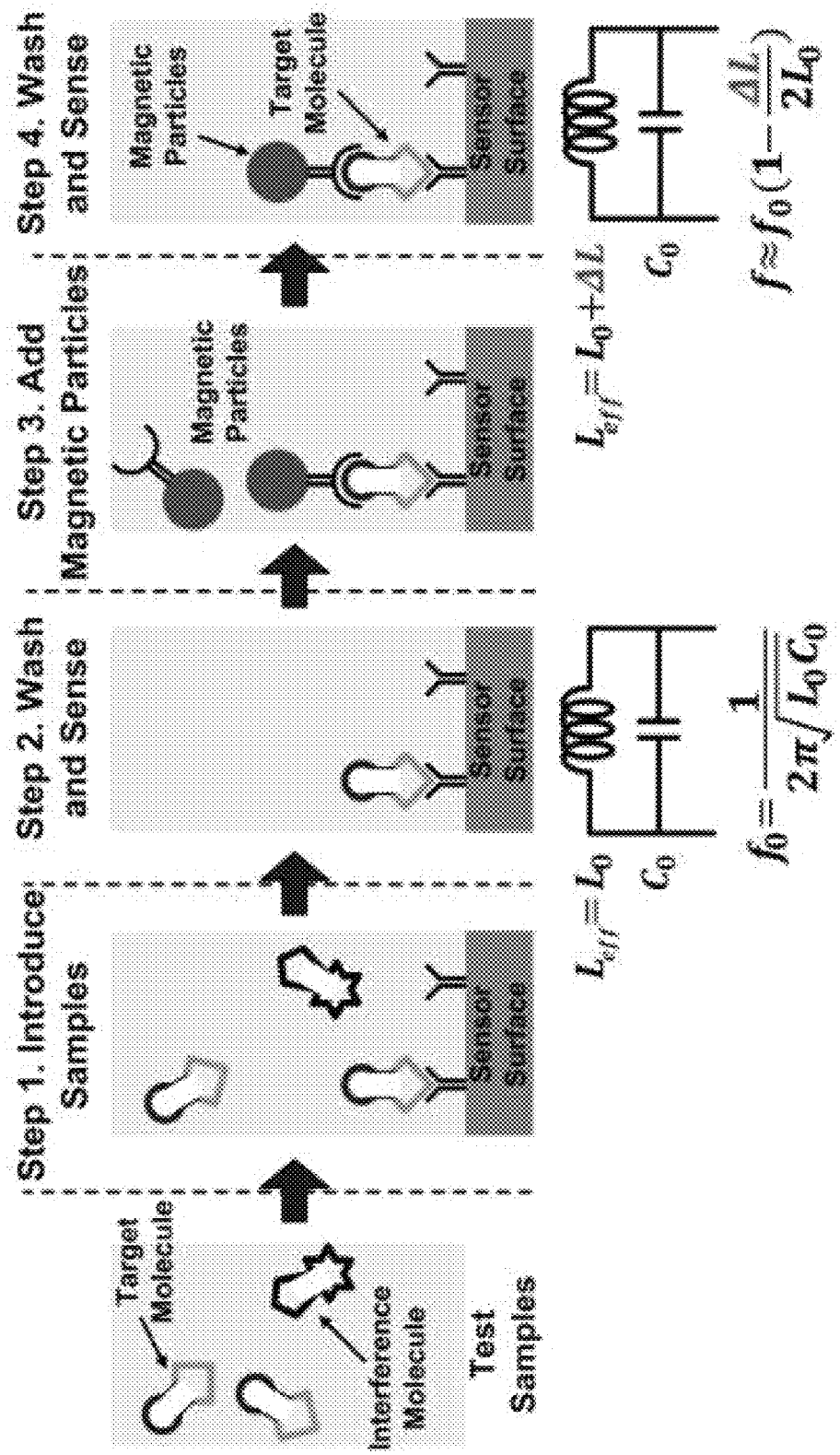
FIG. 3 is a diagram that illustrates a process for sensing materials of interest using an inductive frequency shift magnetic sensing scheme, according to principles of the invention.

We describe a general detection platform for sensing a magnetic and/or an electrical energy change or at least one of an electrical property and a magnetic property. Sensing a magnetic and/or an electrical energy change has been used widely as a detection method in sensor area. This magnetic and/or electrical energy change is often captured by the resonance frequency-shift of a designed LC sensing tank. LC oscillator based frequency-shift sensing is shown to be an ultrasensitive sensing scheme to detect the magnetic and/or electrical energy change, caused by the test samples. Based on the noise floor study of the LC oscillator based sensor, a noise cancellation method is also described which increases the sensor SNR without power overhead. The LC oscillator based frequency-shift sensing and the noise cancellation method form a general detection ultrasensitive platform for advanced sensor design which detects magnetic and/or electrical energy change. Applications in biosensing are contemplated, among other possible uses. In some embodiments, one sensor of a plurality of sensors measures electrically and a different sensor of the plurality of sensors measures magnetically. In some embodiments, the same sensor measures electrically and magnetically in two different measurement intervals. In some embodiments, the same sensor measures electrically and magnetically in the same measurement interval.

FIG. 1A and FIG. 1B show the basic concept of LC resonance change widely used by modern sensor designs to detect the magnetic ($\Delta E_{magnetic}$)/electrical($\Delta E_{electrical}$) energy change from the test samples. This energy change may be caused by sample material change or polarization field change. Through a designed LC resonator, this energy change is captured as effective inductance/capacitor change, which then leads to resonance change of the detection LC tank, such as frequency shift or amplitude change.

In general, the relative frequency shift caused by the magnetic and/or electrical energy change is very small for high sensitivity detection applications, e.g., several part-per-million (ppm). We describe a method to detect this small change, and an LC oscillator based frequency shift sensing scheme is presented. Compared with the LC tank impedance profile, the phase noise profile of the LC oscillator (based on the same LC tank) experiences a significant line-width compression effect, often on the order of $10^8 \sim 10^9$. This highly compressed line-width enables the detection of this tiny frequency shift, as illustrated in FIG. 2A and FIG. 2B.

This LC oscillator sensing scheme is fully compatible with standard integrated circuit processes, such as CMOS. Moreover, this scheme does not require any post-processing and/or external magnetic/electrical bias fields. Therefore, it can be implemented with a high-volume, high-yield and low cost process.

The noise floor of the LC oscillator scheme can be analyzed which indicates that its noise floor is dominated by the jitter caused by the close-in phase noise of the LC oscillator, such as $1/f^3$ phase noise in CMOS process. This close-phase noise is due to the low frequency noise in the circuit which is up-converted to the fundamental oscillation tone due to the oscillator operation. Since this low frequency noise experience large time constant for their autocorrelation function, a noise cancellation scheme based on differential sensing is proposed to cancel this noise. Essentially, the sensor can be designed in such a way where this low frequency noise maintains certain correlation during the sensing operation and the reference operation. Therefore, by subtracting the sensor output from the sensing operation and the sensor output from the reference operation, the differential sensor output noise, caused by the jitter due to the low frequency noise can be greatly cancelled. This directly results in noise suppression and SNR improvement. Moreover, since this scheme only requires the establishment of the noise correlation between the sensing and the reference operation, there does not exit explicit tradeoff with power consumption. This enables the possibility of noise cancellation with no power overhead.

Portable microarrays are promising for Point-of-Care (POC) medical applications, such as disease detection, control, and monitoring, where the key technical challenges are hand-held portability, high sensitivity, battery-level power consumption, and low cost.

Magnetic biosensors in the form of portable microarrays are described that can replace or augment conventional fluorescent sensors, which need bulky and expensive optical systems. However, all magnetic sensors reported thus far require external bias magnetic fields and/or complicated post-processing, which is a negative limitation on their form factor and cost.

An ultrasensitive frequency-shift sensing scheme is described that is expected to address these issues. Here, the fundamental noise floor of this sensing scheme is modeled, and a noise suppression technique, Correlated Double Counting (CDC), is described and implemented which achieves 6 dB of noise reduction without any power overhead in the sensor array.

First we describe the frequency-shift magnetic sensing scheme and the noise suppression technique. We then present a CMOS sensor array implementing the technique. The sensor's noise suppression performance is characterized. Its magnetic sensing capability is demonstrated. It is expected that sensors made according to the principles of the invention will be operable in hand-held, battery-powered, analytical instruments having microprocessor-based control, data recording, and display systems that operate under instructions recorded in machine-readable form in non-volatile memory.

Sensing Scheme and Noise Suppression Technique

FIG. 3 is a diagram that illustrates a process for sensing materials of interest using an inductive frequency shift magnetic sensing scheme, according to principles of the invention. Magnetic sensing is typically accomplished by a sandwich bioassay. Target molecules present in a test sample are introduced into the vicinity of the sensor. The target molecules are first captured by molecular probes pre-deposited onto the sensor surface. The sensor is washed as needed to remove unbound material. The sensor is operated to obtain a first response. Magnetic particles (labels) coated with other types of probes are then added and immobilized by the captured target molecules. The sensor is again washed as needed to remove unbound material. The sensor is operated to obtain a second response. The first response and the second response are treated as data, from which the presence of magnetically labeled material of interest can be computed, and a result obtained. The result can be recorded, displayed and/or transmitted to another device for further processing. Therefore, one can detect the presence of target molecules in the sample by sensing the magnetic labels left on the surface.

Frequency Shift Magnetic Sensing and Noise Analysis

In the frequency-shift sensing scheme, the inductor of an on-chip LC oscillator functions as the sensing core. The AC current through the inductor generates a magnetic field to polarize the magnetic particles that are present. This polarization increases the total magnetic energy in the space and thus leads to an effective increase in the inductance of the sensing inductor. Consequently, the on-chip LC oscillator senses this inductance increase via a corresponding downshift in oscillation frequency.

The oscillation frequency is measured by frequency counting (e.g., recording the number of transitions, such as rising edges, or such as falling edges, within a given counting time T). Therefore, the noise floor is set by the timing jitter ($\sigma_T^2$) of the waveform which is determined by its phase noise spectrum, $S_\phi(\omega)$. The relative frequency error $\sigma_{\Delta f/f_0}^2$ in frequency counting can thus be calculated as $$\sigma_{\Delta f/f_0}^2 = \frac{(\Delta f)^2}{f_0^2} = \frac{\sigma_T^2}{T^2} = \frac{1}{T^2\omega_0^2}E\{[\phi(T)-\phi(0)]^2\} \quad (1)$$

$$= \frac{4}{\pi\omega_0^2 T^2}\int_0^{+\infty} S_\phi(\omega)\sin^2\frac{\omega T}{2}\, d\omega,$$

where $f_0=\omega_0/2\pi$ is the oscillation frequency and $\omega$ is the offset frequency for the SSB phase noise, $S_{1\phi}(\omega)$. The quantity $(\Delta f)^2$ represents the frequency uncertainty during counting.

At a short counting time ($T \ll 2\pi/\omega_{1/f}^3$), where $\omega_{1/f}^3$ is the $1/f^3$ corner frequency of the phase noise $S_\phi(\omega)$), $1/f^2$ noise dominates the jitter and $\sigma_{\Delta f/f_0}^2$ is inversely proportional to T:

$$\sigma_{\Delta f/f_0}^2 = \frac{\sigma_T^2}{T^2} = \frac{\kappa^2 T}{T^2} = \frac{\kappa^2}{T}, \quad (2)$$

where $\kappa$ is the $1/f^2$ jitter coefficient for the oscillator.

For a large counting interval ($T \gg 1/f_{1/f}^3$), $1/f^3$ phase noise dominates and leads to $\sigma_{\Delta f/f_0}^2$ independent of T:

$$\sigma_{\Delta f/f_0}^2 = \frac{\sigma_T^2}{T^2} = \frac{\zeta^2 T^2}{T^2} = \zeta^2, \quad (3)$$

where $\zeta$ is the $1/f^3$ jitter coefficient.

Figure 4:
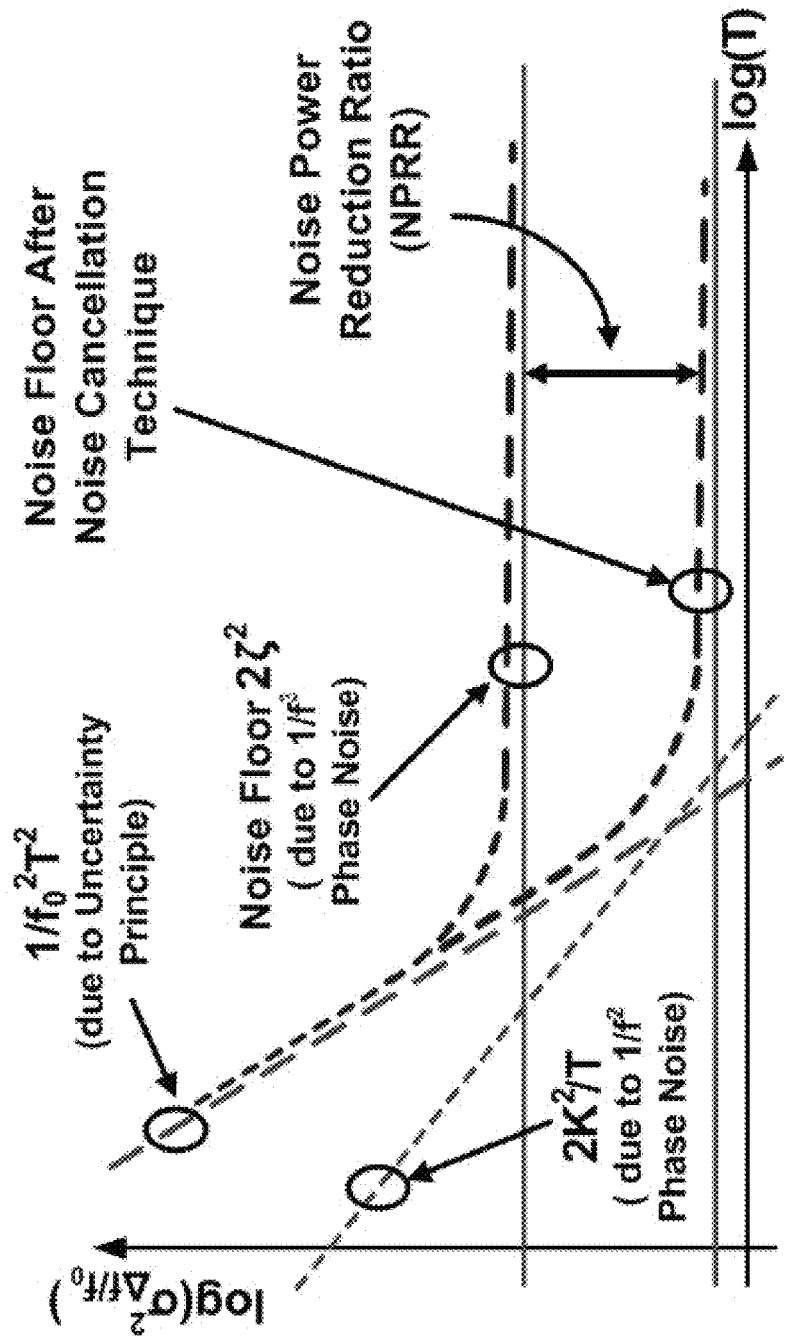
FIG. 4 is a graph that shows various noise components and a noise floor for oscillator based frequency shift sensing, according to principles of the invention.

Moreover, due to the uncertainty principle (effect of finite counting window length), there exists a measurement error proportional to $1/f^2T^2$. The total frequency uncertainty can be plotted, which shows that $\zeta^2$ determines the ultimate sensor noise floor. FIG. 4 is a graph that shows various noise components and a noise floor for oscillator based frequency shift sensing including noise cancellation.

In practical sensor designs, differential sensing is used by pairing a sensing oscillator with a reference oscillator. Their frequency difference is taken as the sensor output to eliminate common-mode drift due to effects, such as supply and temperature variations. In differential sensing, an extra factor of 2 appears in $\sigma_{\Delta f/f_0}$ for noise power doubling, $$\sigma_{\Delta f/f_0}^2 = \frac{8}{\pi\omega_0^2 T^2}\int_0^{+\infty} S_\phi(\omega)\sin^2\frac{\omega T}{2}\, d\omega. \quad (4)$$

Correlated Double Counting (CDC) Noise Suppression Technique

Based on the analysis above, $1/f^3$ phase noise (captured by the $\zeta^2$ coefficient) sets the minimum sensor noise floor. This $1/f^3$ phase noise is determined by the flicker noise of the devices and the waveform properties of the oscillators and is generally difficult to reduce beyond a certain level. Based on Equation (3), the $1/f^3$ noise jitter ($\zeta^2 T^2$) accumulates at a faster rate due to its long correlation time. While this correlation results in a higher integrated noise power, it also creates a possibility of noise cancellation.

In a normal differential sensing method, the jitters are uncorrelated between the sensing and the reference oscillator, which gives the additional factor of 2 in Equation (4). However, if the $1/f^3$ phase noise is correlated between the two oscillators, this correlated noise can be subtracted by a correlated double counting (CDC) scheme, where subtracting one frequency count from the other will reduce the correlated noise component and thus lowers the measurement uncertainty floor as shown in FIG. 4.

Figures 5A, 5B, 5C:
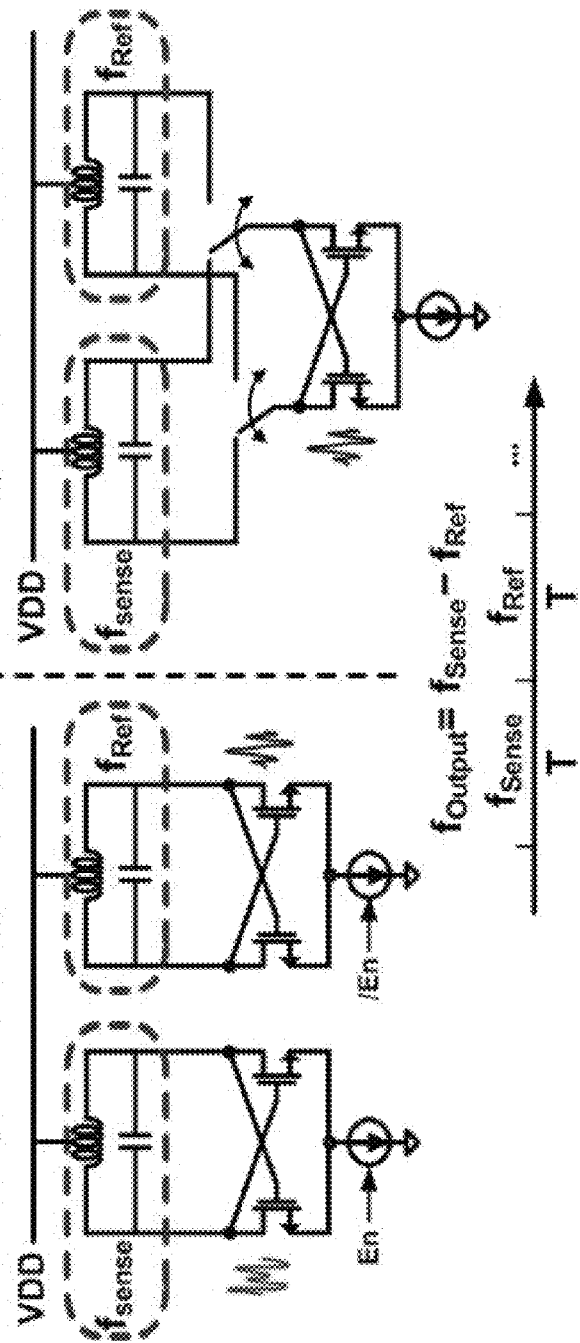
FIG. 5A is a circuit diagram showing a circuit used to perform conventional or "normal" differential sensing scheme.
FIG. 5B is a circuit diagram showing a circuit used to perform sensing using correlated double counting (CDC), according to principles of the invention.
FIG. 5C is a timing diagram illustrating the relative timing of the reference and sense measurement steps or intervals used in performing the CDC, according to principles of the invention.

FIG. 5A is a circuit diagram showing a circuit used to perform conventional or "normal" differential sensing scheme. Since $1/f^3$ phase noise is mainly caused by flicker noise upconversion of the active devices in a CMOS oscillator, one can design the two oscillators in a way to increase the flicker noise correlation between the reference and sensing cores, e.g., active core sharing, during differential operation, for example as shown in FIG. 5B. FIG. 5B is a circuit diagram showing a circuit used to perform sensing using correlated double counting (CDC), according to principles of the invention.

FIG. 5C is a timing diagram illustrating the relative timing of the reference and sense measurement steps or intervals used in performing the CDC, according to principles of the invention.

This noise suppression technique is analogous to the Correlated Double Sampling (CDS) often used in image sensors. This CDC scheme for our sensor does not increase the power consumption or chip area. Moreover, this CDC scheme with oscillator based frequency-shift sensing provides a general sensor design methodology which can be applied to any type of sensor that measures LC resonant changes, e.g., capacitive sensing in pressure sensors.

Figure 6:
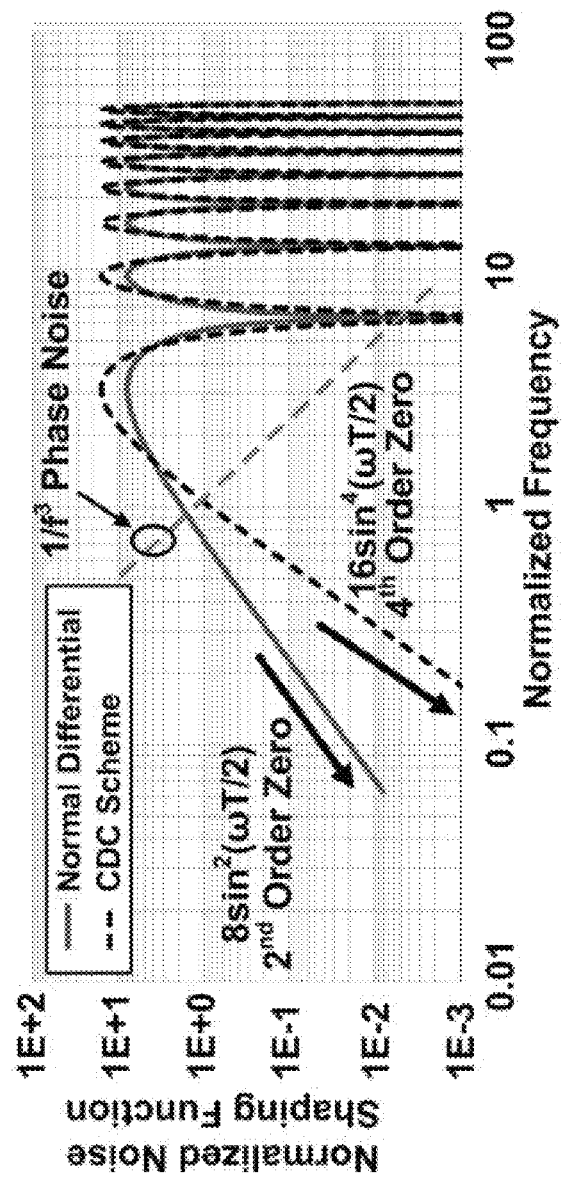
FIG. 6 is a graph that shows and compares the normalized Noise Shaping Functions that can be attained using conventional differential sensing and the CDC sensing scheme, as a function of frequency.

The scheme can be modeled mathematically. Assuming $\phi(t)$ as the correlated random phase of the oscillator waveform, the effective noise for CDC scheme is:

$$\sigma^2_{\Delta f/f_0} = \frac{1}{T^2 \omega_0^2} = E\{[\phi(2T) - \phi(T) - [\phi(T) - \phi(0)]]^2\} \quad (5)$$

$$= \frac{16}{\pi \omega_0^2 T^2} \int_0^{+\infty} S_\phi(\omega) \sin^4\left[\frac{\omega T}{2}\right] d\omega,$$

where T is the counting time and $\omega_0$ is the nominal oscillation frequency. From Equation (4) and Equation (5), noise shaping functions for normal differential scheme and CDC scheme can be defined and plotted, as shown in FIG. 6. Compared with the normal differential case, the CDC provides a 4th order zero at low frequency offsets enabling the suppression on the $1/f^3$ phase noise.

Furthermore, assuming a $1/f^3$ phase noise profile of $S_{\phi,1/f^3}(\omega)$, the Noise Power Reduction Ratio (NPRR) between the two schemes can be numerically calculated as $$NPRR = \frac{\sigma^2_{\Delta f/f_0,diff}}{\sigma^2_{\Delta f/f_0,CDFC}} = \frac{\frac{8}{\pi \omega_0^2 T^2} \int_0^{+\infty} S_{\phi,\frac{1}{f^3}}(\omega) \sin^2 \frac{\omega T}{2} d\omega}{\frac{16}{\pi \omega_0^2 T^2} \int_0^{+\infty} S_{\phi,\frac{1}{f^3}}(\omega) \sin^4\left[\frac{\omega T}{2}\right] d\omega} \quad (6)$$

$$= 2\zeta^2 / \sigma^2_{\Delta f/f_0,CDFC} \approx 9.8 \text{ dB},$$

where calculating $\zeta^2$ for a given $1/f^3$ phase noise can be performed by well-known techniques. Equation (6) shows that a noise reduction ratio of up to 9.8 dB can be achieved by the proposed CDC scheme.

Sensor System Implementation

We mow present a 64-cell sensor array is implemented in a 65 nm CMOS process with the CDC scheme as a design example.

Quad-Core Sensor Cell

Figure 7:
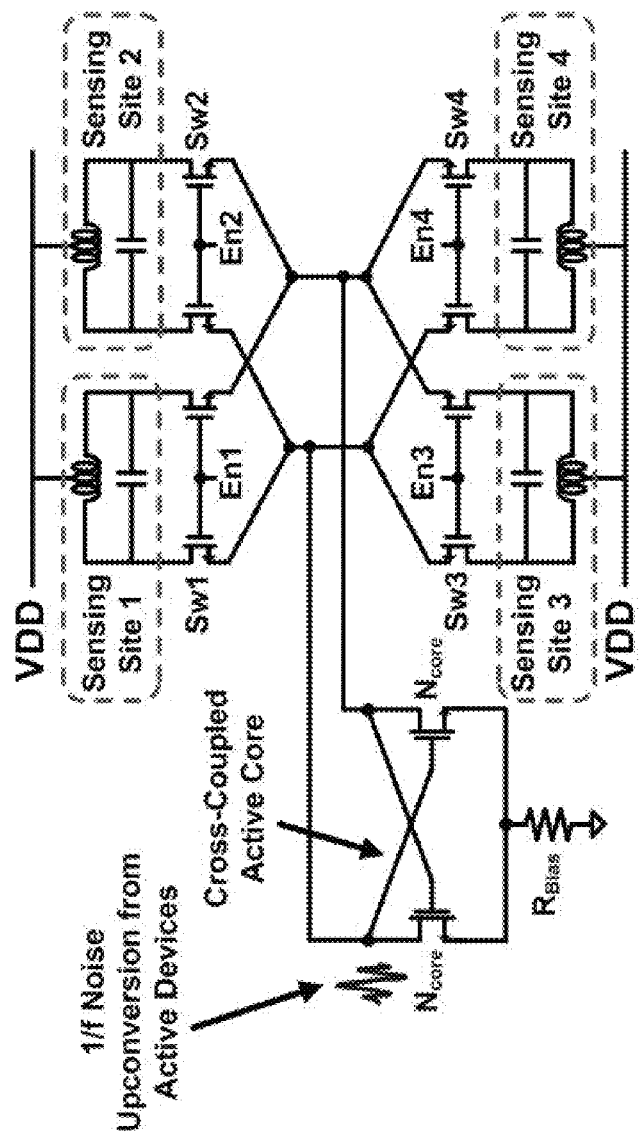
FIG. 7 is a schematic circuit diagram illustrating an exemplary quad-core CDFC sensor cell, according to principles of the invention.

Each sensor cell in the array is designed with four sensing sites (e.g., four sensing inductors) where any of the four can be selected to function as the reference sensor and the other three as active sensors, as illustrated in FIG. 7. FIG. 7 is a schematic circuit diagram illustrating an exemplary quad-core CDFC sensor cell.

To maintain correlation of the $1/f^3$ phase noise between differential sensing, the four sensing inductors are designed to share the same cross-coupled core, whose up-converted flicker noise dominates the $1/f^3$ phase noise. NMOS switches are used to couple the desired LC tank with the active core. The switches are optimized to minimize their $1/f^3$ phase noise which is uncorrelated during differential sensing and cannot be suppressed by the CDC scheme. The sensing oscillators' nominal frequency is 1 GHz.

Sensor System Architecture

Figure 8:
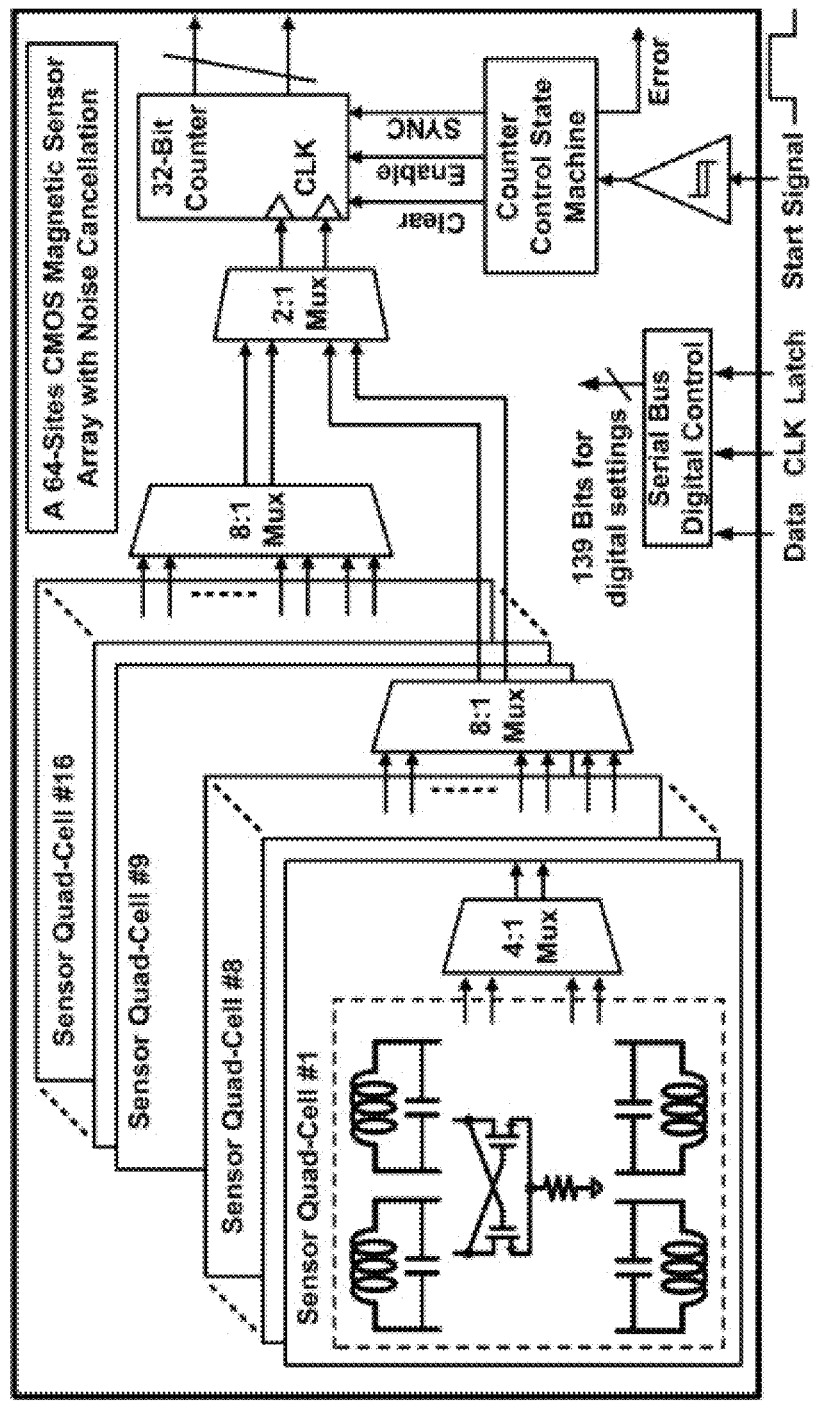
FIG. 8 is a schematic diagram that illustrates a preferred embodiment of a sensor system architecture having 64 sensing cells.

The complete sensor system architecture is shown in FIG. 8. Sixteen quad-cell sensor cells are implemented on the same CMOS chip for high throughput. Multiplexers are designed to feed the sensing oscillator output to the on-chip frequency counter. Since only one of the sensing sites in each quad-cell is needed to act as the reference, each chip has 48 useful sensor sites overall. Moreover, this architecture is scalable to a large scale array on one chip. In addition, since the sensor chip's IOs only have DC supply and digital inputs/outputs, multiple chips can easily be tiled for ultra-high throughput applications, such as genomic sequencing and genotyping.

Figures 9A, 9B:
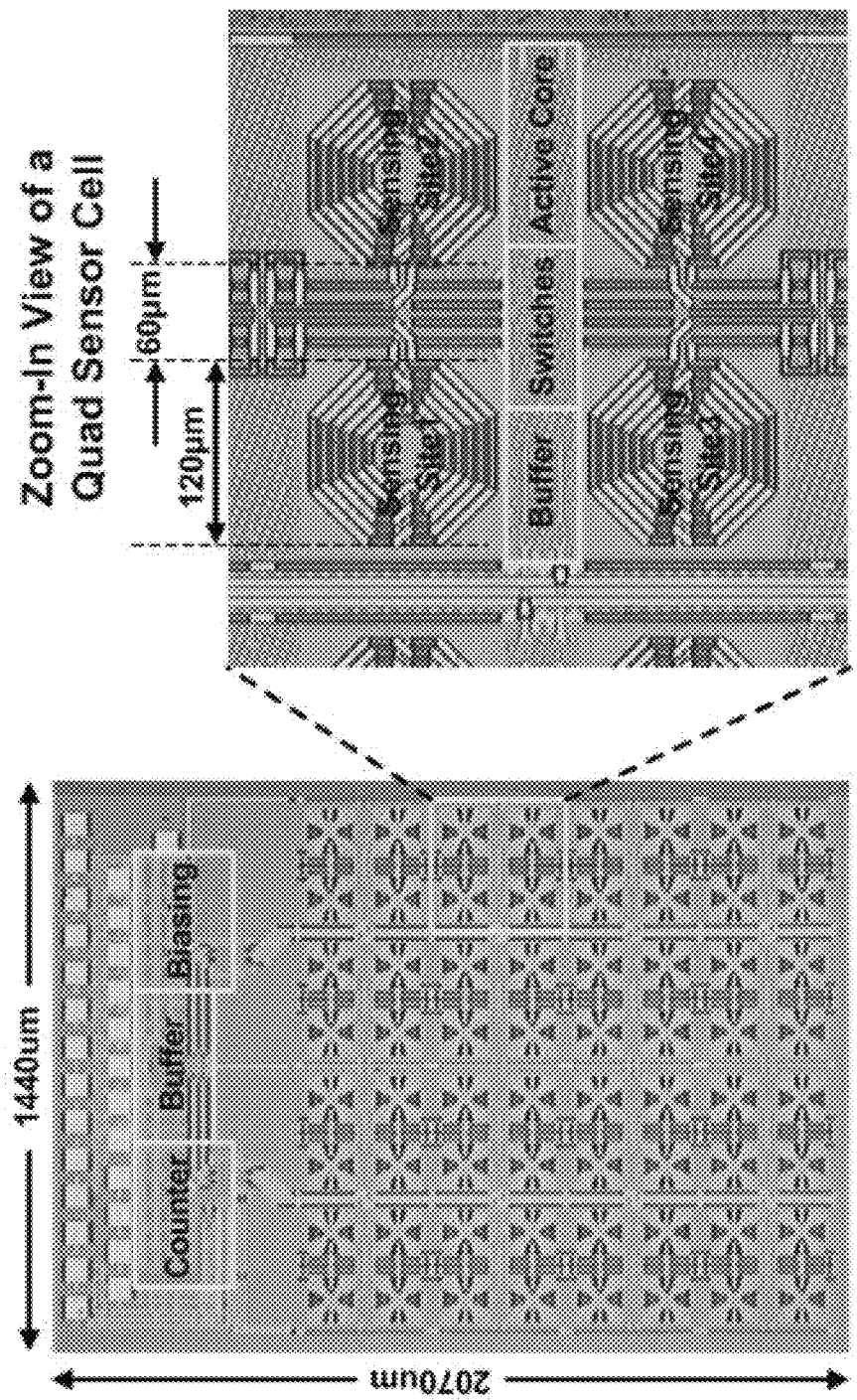
FIG. 9A is a chip microphotograph showing a device having 64 sensor cells.
FIG. 9B is a chip microphotograph showing section of the device of FIG. 9A, showing a quad sensor cell in greater detail.

The chip microphotograph is shown in FIG. 9A and FIG. 9B. FIG. 9A is a chip microphotograph showing a device having 64 sensor cells. FIG. 9B is a chip microphotograph showing section of the device of FIG. 9A, showing a quad sensor cell in greater detail. The sensing inductor is a 120 μm 6-turn symmetric spiral with Q of 6.8 at 1 GHz. The sensing inductor spacing of 60 μm is chosen to balance the integration level with the coupling from adjacent cells. The total system power consumption is 80 mW.

Sensor Electrical Performance

Figure 10:
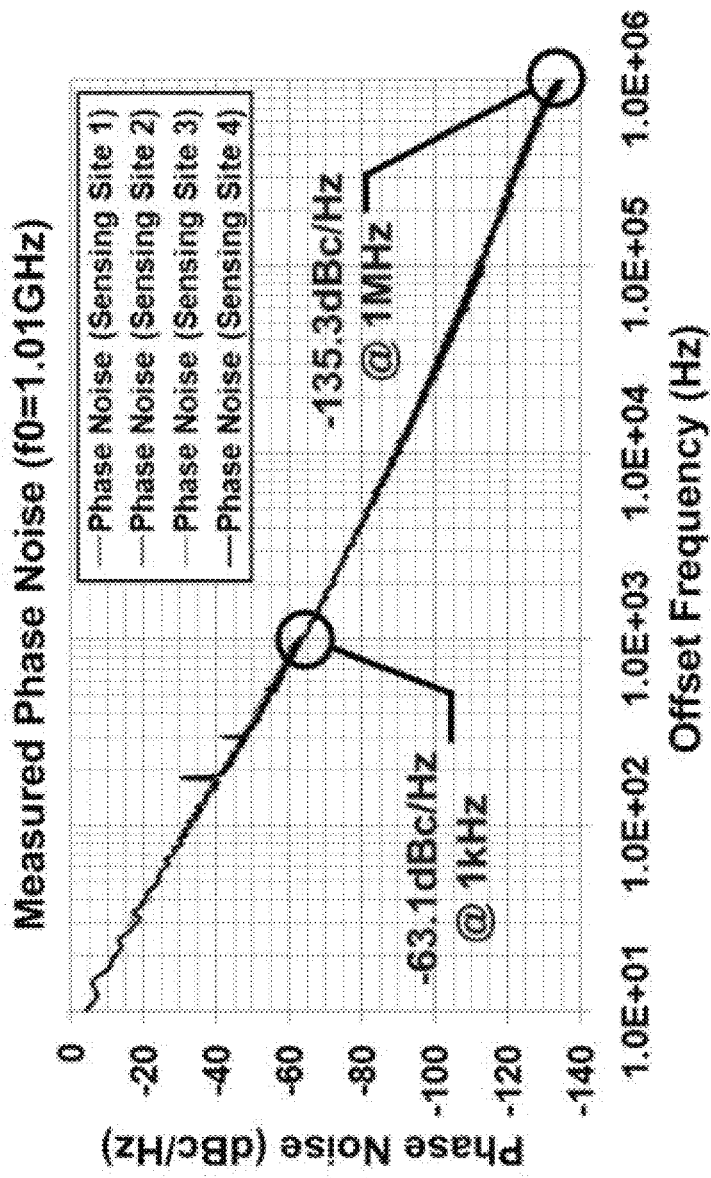
FIG. 10 is a graph illustrating measured sensor oscillator phase noise as a function of frequency for four sensing sites in a quad sensor cell, according to principles of the invention.

The sensor oscillator's phase noise is measured with an RDL phase noise analyzer, achieving −63.1 dBc/Hz and −135.3 dBc/Hz at 1 kHz and 1 MHz offsets, respectively, as shown in FIG. 10. FIG. 10 is a graph illustrating measured sensor oscillator phase noise as a function of frequency for four sensing sites in a quad sensor cell.

Figure 11:
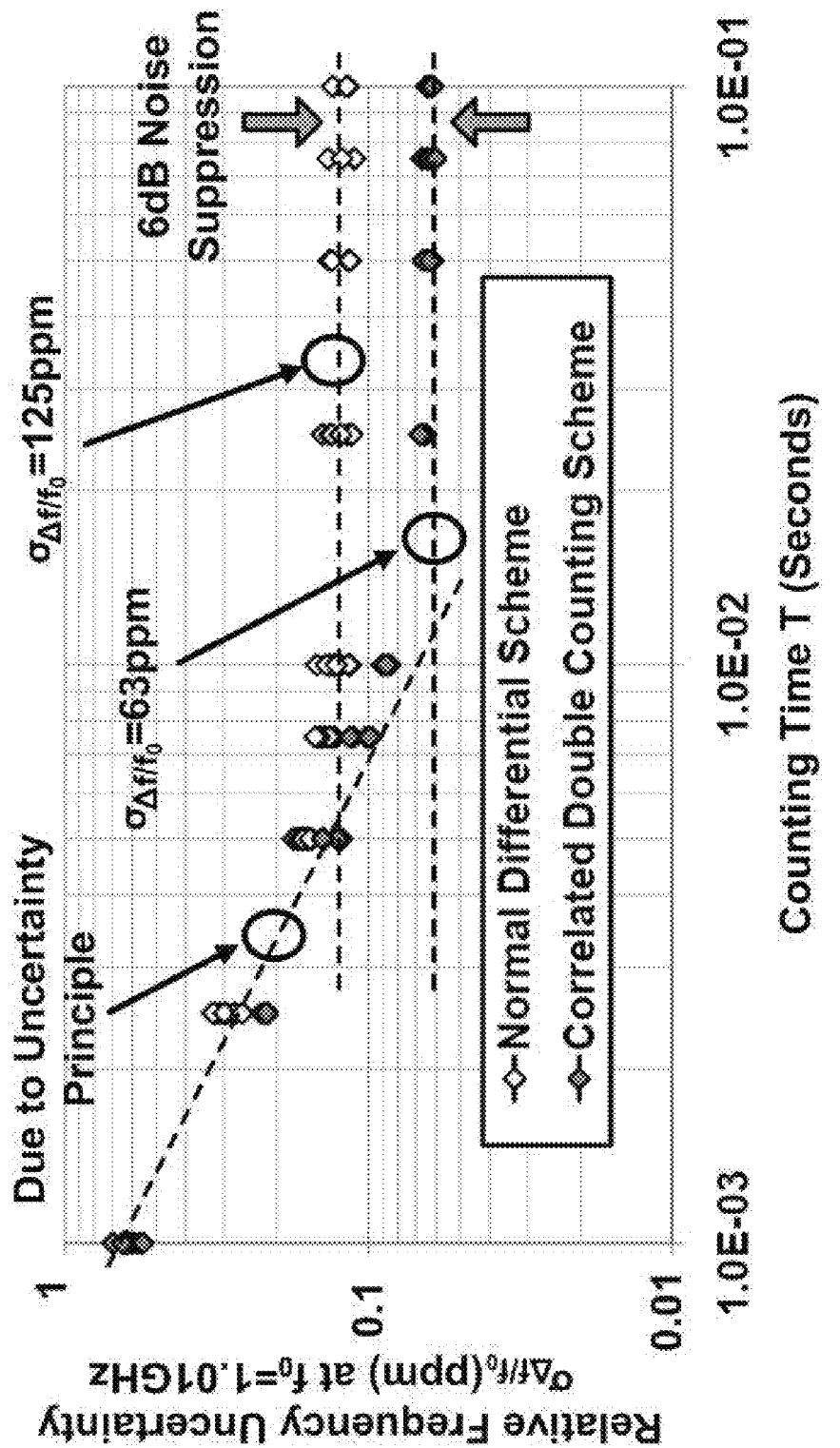
FIG. 11 is a graph showing frequency counting uncertainty as a function of different counting times, which compares results for conventional differential sensing and the CDC sensing scheme.

The noise suppression functionality of the CDC scheme is verified through frequency counting. The standard deviation for relative frequency is measured with respect to different counting time T as shown in FIG. 11. The correlated noise case is sampled from one quad-core cell, while the normal differential case is measured using oscillators which are from different cores but spatially adjacent to cancel their thermal drift. Note that the error slope (due to the uncertainty principle) is −10 dB/decade, which agrees with the analysis given hereinabove.

Figure 12:
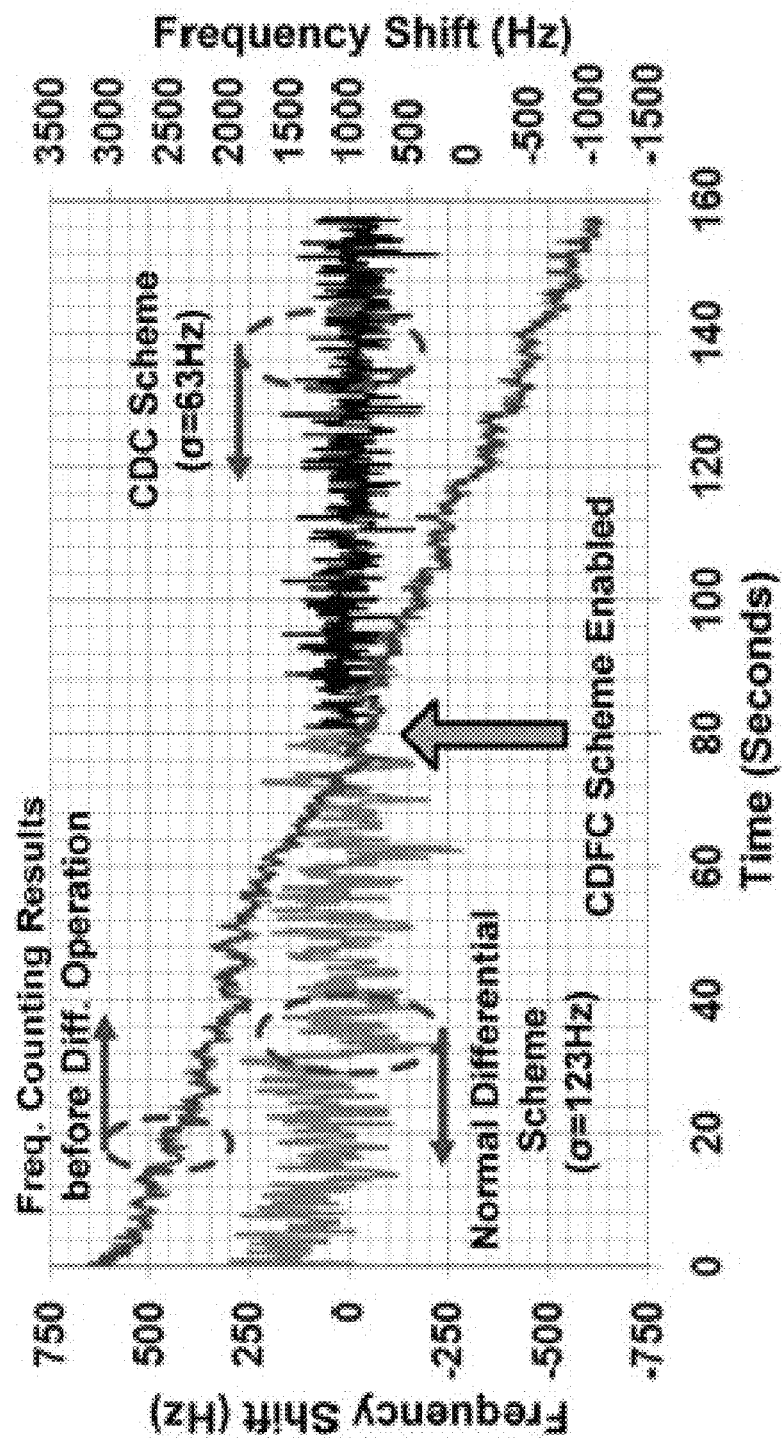
FIG. 12 is a graph showing the frequency counting results in the time domain for the CDC scheme, for normal differential sensing, and for no differential operation.

At large counting intervals (T>0.01 s), the measured sensor noise reaches the minimal noise floor set by the $1/f^3$ phase noise. The CDC scheme achieves a 6 dB noise floor suppression compared with the normal differential scheme. This value is smaller than the theoretically predicted 9.8 dB, which is mainly because part of the total $1/f^3$ phase noise is uncorrelated noise from the switch transistors. The frequency counting results for different schemes are shown in FIG. 12.

Sensor Magnetic Sensing Performance

Figure 13:
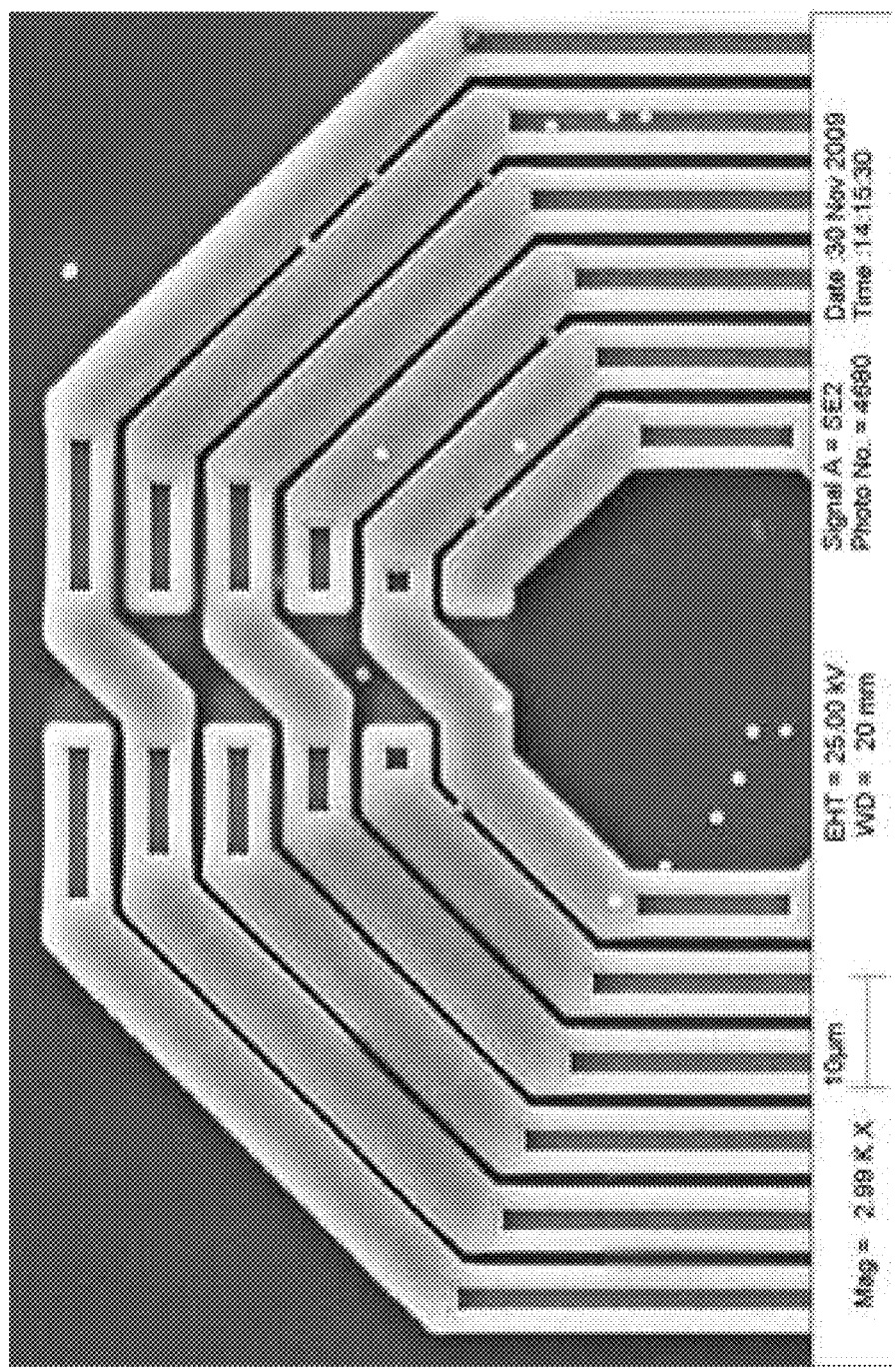
FIG. 13 is a scanning electron microscope (SEM) image for one sensor site with a number of deposited magnetic beads.

To verify the magnetic sensing capability of the sensor, DynaBeads® MyOne™ Carboxylic Acid (Diameter=1 μm), were used as test samples. Solutions with different bead concentrations were deposited onto the sensing site, and the corresponding frequency shifts were measured. The exact quantity of the beads on each site was obtained from scanning electron microscope (SEM) images, such as that shown in FIG. 13.

Figure 14:
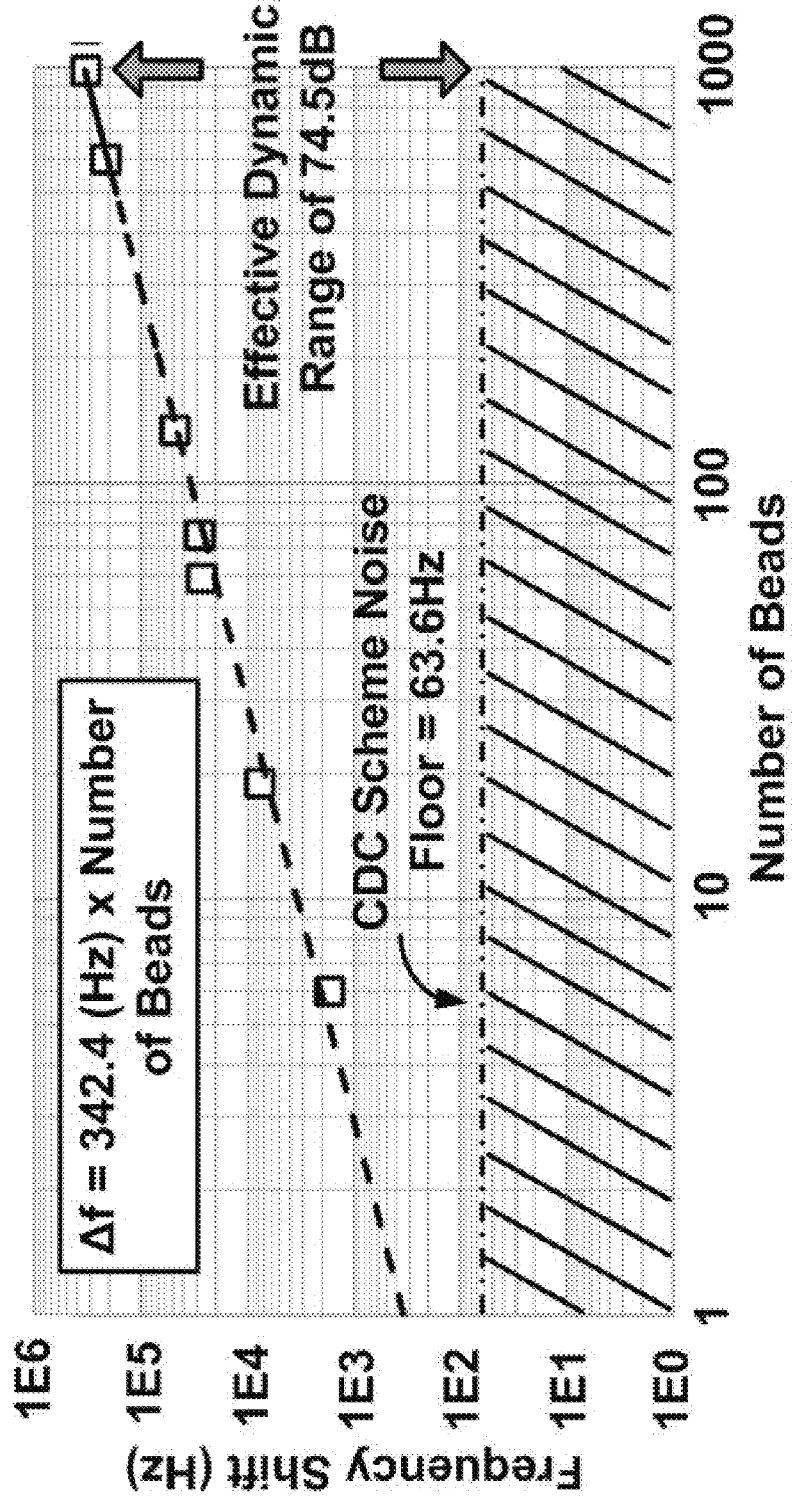
FIG. 14 is a graph of the CDC sensor response for different numbers of beads.

The sensor frequency shift with respect to different bead numbers is shown in FIG. 14. The extrapolated frequency shift for one single bead is 342.4 Hz with an SNR of 14.6 dB before averaging. The measured sensor linear response (up to 983 beads) indicates an effective dynamic range of at least 74.5 dB. Experiments with bio-samples on genomics level (DNA/RNA) and cellular level (bacteria) demonstrated that the sensing array operates as expected.

Definitions

Recording the results from an operation or data acquisition, such as for example, recording results at a particular frequency or wavelength, is understood to mean and is defined herein as writing output data in a non-transitory manner to a storage element, to a machine-readable storage medium, or to a storage device. Non-transitory machine-readable storage media that can be used in the invention include electronic, magnetic and/or optical storage media, such as magnetic floppy disks and hard disks; a DVD drive, a CD drive that in some embodiments can employ DVD disks, any of CD-ROM disks (i.e., read-only optical storage disks), CD-R disks (i.e., write-once, read-many optical storage disks), and CD-RW disks (i.e., rewriteable optical storage disks); and electronic storage media, such as RAM, ROM, EPROM, Compact Flash cards, PCMCIA cards, or alternatively SD or SDIO memory; and the electronic components (e.g., floppy disk drive, DVD drive, CD/CD-R/CD-RW drive, or Compact Flash/PCMCIA/SD adapter) that accommodate and read from and/or write to the storage media. Unless otherwise explicitly recited, any reference herein to "record" or "recording" is understood to refer to a non-transitory record or a non-transitory recording.

As is known to those of skill in the machine-readable storage media arts, new media and formats for data storage are continually being devised, and any convenient, commercially available storage medium and corresponding read/write device that may become available in the future is likely to be appropriate for use, especially if it provides any of a greater storage capacity, a higher access speed, a smaller size, and a lower cost per bit of stored information. Well known older machine-readable media are also available for use under certain conditions, such as punched paper tape or cards, magnetic recording on tape or wire, optical or magnetic reading of printed characters (e.g., OCR and magnetically encoded symbols) and machine-readable symbols such as one and two dimensional bar codes. Recording image data for later use (e.g., writing an image to memory or to digital memory) can be performed to enable the use of the recorded information as output, as data for display to a user, or as data to be made available for later use. Such digital memory elements or chips can be standalone memory devices, or can be incorporated within a device of interest. "Writing output data" or "writing an image to memory" is defined herein as including writing transformed data to registers within a microcomputer.

"Microcomputer" is defined herein as synonymous with microprocessor, microcontroller, and digital signal processor ("DSP"). It is understood that memory used by the microcomputer, including for example instructions for data processing coded as "firmware" can reside in memory physically inside of a microcomputer chip or in memory external to the microcomputer or in a combination of internal and external memory. Similarly, analog signals can be digitized by a standalone analog to digital converter ("ADC") or one or more ADCs or multiplexed ADC channels can reside within a microcomputer package. It is also understood that field programmable array ("FPGA") chips or application specific integrated circuits ("ASIC") chips can perform microcomputer functions, either in hardware logic, software emulation of a microcomputer, or by a combination of the two. Apparatus having any of the inventive features described herein can operate entirely on one microcomputer or can include more than one microcomputer.

General purpose programmable computers useful for controlling instrumentation, recording signals and analyzing signals or data according to the present description can be any of a personal computer (PC), a microprocessor based computer, a portable computer, or other type of processing device. The general purpose programmable computer typically comprises a central processing unit, a storage or memory unit that can record and read information and programs using machine-readable storage media, a communication terminal such as a wired communication device or a wireless communication device, an output device such as a display terminal, and an input device such as a keyboard. The display terminal can be a touch screen display, in which case it can function as both a display device and an input device. Different and/or additional input devices can be present such as a pointing device, such as a mouse or a joystick, and different or additional output devices can be present such as an enunciator, for example a speaker, a second display, or a printer. The computer can run any one of a variety of operating systems, such as for example, any one of several versions of Windows, or of MacOS, or of UNIX, or of Linux. Computational results obtained in the operation of the general purpose computer can be stored for later use, and/or can be displayed to a user. At the very least, each microprocessor-based general purpose computer has registers that store the results of each computational step within the microprocessor, which results are then commonly stored in cache memory for later use.

Many functions of electrical and electronic apparatus can be implemented in hardware (for example, hard-wired logic), in software (for example, logic encoded in a program operating on a general purpose processor), and in firmware (for example, logic encoded in a non-volatile memory that is invoked for operation on a processor as required). The present invention contemplates the substitution of one implementation of hardware, firmware and software for another implementation of the equivalent functionality using a different one of hardware, firmware and software. To the extent that an implementation can be represented mathematically by a transfer function, that is, a specified response is generated at an output terminal for a specific excitation applied to an input terminal of a "black box" exhibiting the transfer function, any implementation of the transfer function, including any combination of hardware, firmware and software implementations of portions or segments of the transfer function, is contemplated herein, so long as at least some of the implementation is performed in hardware.

Theoretical Discussion

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

Any patent, patent application, or publication identified in the specification is hereby incorporated by reference herein in its entirety. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

While the present invention has been particularly shown and described with reference to the preferred mode as illustrated in the drawing, it will be understood by one skilled in the art that various changes in detail may be affected therein without departing from the spirit and scope of the invention as defined by the claims.

What is claimed is:

1. A sensor array, comprising:
a plurality of sensors fabricated on a monolithic semiconductor substrate, each of said plurality of sensors configured to measure an electrical property or a magnetic property of a specimen of interest, each of said plurality of sensors having an output terminal connected to said sensor with a respective switch, each of said plurality of sensors configured to provide a non-volatile signal at a respective output terminal thereof;
an active core configured to be coupled to each of said respective output terminals of each of said plurality of sensors, said active core configured to sense said non-volatile signal of each of said plurality of sensors during a time period when said respective switch is closed;
an oscillator configured to provide an oscillation signal to each of said sensors;
a frequency counter, said frequency counter configured to be switchably coupled to each of said plurality of sensors, said frequency counter configured to count a number of transitions within a given counting time T and to provide said count as an output; and
a controller configured to control a connectivity of said plurality of sensors with said oscillator and said frequency counter, and configured to provide as output a non-volatile signal representative of said count provided by said frequency counter for a respective one of said plurality of sensors during said given counting time T.

2. The sensor array of claim 1, wherein said plurality of sensors and said core are compatible with fabrication by a CMOS process.

3. The sensor array of claim 1, wherein said plurality of sensors is a number N of sensors where N is an integer power of 2.

4. The sensor array of claim 1, wherein each of said sensors comprises an inductor.

5. The sensor array of claim 1, wherein said oscillator is configured to operate in the GHz frequency range.

6. The sensor array of claim 1, wherein said sensor is configured to detect a quantity of magnetic beads in the range of units of magnetic beads to thousands of magnetic beads.

7. The sensor array of claim 1, wherein one of said plurality of sensors is configured to measure an electrical property and a different one of said plurality of sensors is configured to measure a magnetic property.

8. The sensor array of claim 1, wherein one of said plurality of sensors is configured to measure an electrical property and is configured to measure a magnetic property in two different measurement intervals.

9. The sensor array of claim 1, wherein one of said plurality of sensors is configured to measure an electrical property and is configured to measure a magnetic property in the same measurement interval.

10. A sensing method, comprising the steps of:
providing an sensor array, comprising a plurality of sensors configured to measure using a correlated double counting (CDC) scheme at least one of an electrical property and a magnetic property of a specimen of interest;
providing a specimen believed to contain a material of interest to be sensed;
applying at least a portion of said specimen believed to contain a material of interest to at least one sensor of said sensor array, and leaving at least one sensor of said sensor array lacking a portion of said specimen;
sensing a first response of said at least one sensor lacking a portion of said specimen;
sensing a second response of said at least one sensor having a portion of said specimen applied thereto using said correlated double counting (CDC) scheme;
analyzing said first response and said second response to obtain a result indicative of said material of interest to be sensed; and
performing at least one of recording said result, transmitting said result to a data handling system, or to displaying said result to a user.

11. The sensing method of claim 10, wherein said step of applying at least a portion of said specimen believed to contain a material of interest to at least one sensor of said sensor array further comprises the steps of:
as needed, washing said sensor to remove unbound material;
operating said sensor to obtain an initial response;
adding magnetic labels;
as needed, again washing said sensor to remove unbound material; and
operating said sensor to obtain a final response.

12. The sensing method of claim 10, wherein said steps of sensing a first response and sensing a second response are performed as a function of frequency.

13. The sensing method of claim 10, wherein one of said plurality of sensors measures an electrical property and a different one of said plurality of sensors measures a magnetic property.

14. The sensing method of claim 10, wherein one of said plurality of sensors measures an electrical property during a first time interval and measures a magnetic property during a second time interval different from said first time interval.

15. The sensing method of claim 10, wherein one of said plurality of sensors measures an electrical property and measures a magnetic property in the same time interval.

* * * * *